United States Patent
Xia et al.

(10) Patent No.: US 6,303,517 B1
(45) Date of Patent: *Oct. 16, 2001

(54) FAST DEPOSITION ON SPHERICAL-SHAPED INTEGRATED CIRCUITS IN NON-CONTACT CVD PROCESS

(75) Inventors: Changfeng Xia, Plano; Lixin Wu, Dallas, both of TX (US)

(73) Assignee: Ball Semiconductor, Inc., Allen, TX (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/361,793

(22) Filed: Jul. 27, 1999

(51) Int. Cl.[7] .................................................. C23C 16/00
(52) U.S. Cl. ................ 438/758; 427/248.1; 427/255.29; 118/716; 118/724; 118/725
(58) Field of Search .................... 118/716, 724, 118/725; 427/248.1, 255.29; 438/758

(56) References Cited

U.S. PATENT DOCUMENTS

| | | | |
|---|---|---|---|
| Re. 31,473 | 12/1983 | Kilby et al. | 425/6 |
| 4,749,615 | 6/1988 | Bonny et al. | 428/310.6 |
| 5,223,452 | 6/1993 | Knepprath | 437/165 |
| 5,278,097 | 1/1994 | Hotchkiss et al. | 437/164 |
| 5,462,639 | 10/1995 | Matthews et al. | 156/662.1 |
| 5,571,366 | 11/1996 | Ishii et al. | 156/345 |
| 6,015,764 | * 1/2000 | Xia | 118/716 |
| 6,053,123 | * 4/2000 | Xia | 118/723 R |

FOREIGN PATENT DOCUMENTS 02-119241 10/1988 (JP).

* cited by examiner

Primary Examiner—Richard Bueker
(74) Attorney, Agent, or Firm—Haynes and Boone, LLP

(57) ABSTRACT

An apparatus and method for depositing thin films on the surface of a device such as a spherical shaped devices. The apparatus includes an enclosure containing a plurality of apertures and a conductor coil. The apertures connect to conduits for inputting and outputting the devices as well as injecting and releasing different gases and/or processing constituents. A chamber is formed within the enclosure and is configured to be coaxial with the conductor coil. Devices move through the input conduit where they are preheated by a resistance-type furnace. The preheated devices then move into the chamber where chemical precursors are added and the devices are further heated to a predefined temperature associated with the chemical precursors by radio frequency energy from the conductor coil. At this time, the gases and/or processing constituents react with the heated device thereby growing a thin film on its outer surface.

34 Claims, 3 Drawing Sheets

FAST DEPOSITION ON SPHERICAL-SHAPED INTEGRATED CIRCUITS IN NON-CONTACT CVD PROCESS

BACKGROUND OF THE INVENTION

The invention relates generally to semiconductor integrated circuits, and more particularly, to an apparatus and method for fabricating a spherical-shaped semiconductor device.

Conventional integrated circuits, or "chips," are formed from a flat surface semiconductor wafer. The semiconductor wafer is first manufactured in a semiconductor material manufacturing facility and is then provided to a fabrication facility. At the latter facility, several layers are processed onto the semiconductor wafer surface. Once completed, the wafer is then cut into one or more chips and assembled into packages. Although the processed chip includes several layers fabricated thereon, the chip still remains relatively flat.

A fabrication facility is relatively expensive due to the enormous effort and expense required for creating flat silicon wafers and chips. For example, manufacturing the wafers requires several high-precision steps including creating rod-form single crystal semiconductor material; precisely cutting ingots from the semiconductor rods; cleaning and drying the cut ingot sections; manufacturing a large single crystal from the ingots by melting them in a quartz crucible; grinding, etching, and cleaning the surface of the crystal; cutting, lapping and polishing wafers from the crystal; and heat processing the wafers. Moreover, the wafers produced by the above processes typically have many defects which are largely attributable to the difficulty in making a single, highly pure crystal due to the above cutting, grinding and cleaning processes as well as due to the impurities, including oxygen, associated with containers used in forming the crystals. These defects become more and more prevalent as the integrated circuits formed on these wafers become smaller.

Another major problem associated with modern fabrication facilities for flat chips is that they require extensive and expensive equipment. For example, dust-free clean rooms and precisely-controlled manufacturing and storage areas are necessary to prevent the wafers and chips from defecting and warping. Also, these types of fabrication facilities suffer from a relatively inefficient throughput as well as an inefficient use of the silicon. For example, facilities using in-batch manufacturing, where the wafers are processed by lots, must maintain huge inventories to efficiently utilize all the equipment of the facility. Also, because the wafers are round, and the completed chips are rectangular, the peripheral portion of each wafer cannot be used.

Still another problem associated with modern fabrication facilities is that they do not produce chips that are ready to use. Instead, there are many additional steps that must be completed, including cutting and separating the chip from the wafer; assembling the chip to a lead frame which includes wire bonding, plastic or ceramic molding and cutting and forming the leads, positioning the assembled chip onto a printed circuit board; and mounting the assembled chip to the printed circuit board. The cutting and assembly steps introduce many errors and defects due to the precise requirements of such operations. In addition, the positioning and mounting steps are naturally two-dimensional in character, and therefore do not support curved or three dimensional areas.

Therefore, due to these and various other problems, only a few companies in the world today can successfully manufacture conventional flat chips. Furthermore, the chips must bear a high price to cover the costs of manufacturing, as well as the return on initial capital and investment.

In co-pending U.S. patent application Ser. No. 08/858,004 filed on May 16, 1997, assigned to the same assignee as the present application and hereby incorporated by reference, a method and apparatus for manufacturing spherical-shaped semiconductor integrated circuit devices is disclosed. The present invention is specific to an apparatus and method for efficiently depositing thin films on the surface of the spherical shaped devices.

SUMMARY OF THE INVENTION

The present invention, accordingly, provides an apparatus and method for efficiently depositing thin films on the surface of a device such as a spherical shaped devices. To this end, one embodiment provides an enclosure containing a plurality of apertures and a conductor coil. The apertures connect to conduits for inputting and outputting the devices as well as injecting and releasing different inert gases and chemical precursors for chemical vapor deposition. A chamber is formed within the enclosure and is configured to be coaxial with the conductor coil.

Devices move through the input conduit where they are preheated by a resistance-type furnace. The preheated devices then move into the chamber where the chemical precursors are added for the chemical vapor deposition process. The devices are then further heated to a predefined temperature associated with the chemical precursors, by radio frequency energy from the conductor coil. At this time, the chemical precursors react with the heated device thereby growing a thin film on its outer surface.

In one embodiment, the device moves through the chamber responsive to a process gas flowing in a direction opposite to the direction of the device. In this way, the speed of the device through the chamber can be controlled.

Several advantages result from the foregoing. For one, the process gases can treat the spheres in several manners including depositing a thin film on the spheres. Also, the spheres can be continuously introduced into the chamber to facilitate a pipeline production process. Further, the method of the present invention can be carried out in a relatively small space, thereby reducing or eliminating the need for a clean room environment.

DESCRIPTION OF THE PREFERRED EMBODIMENT

Figure 1:
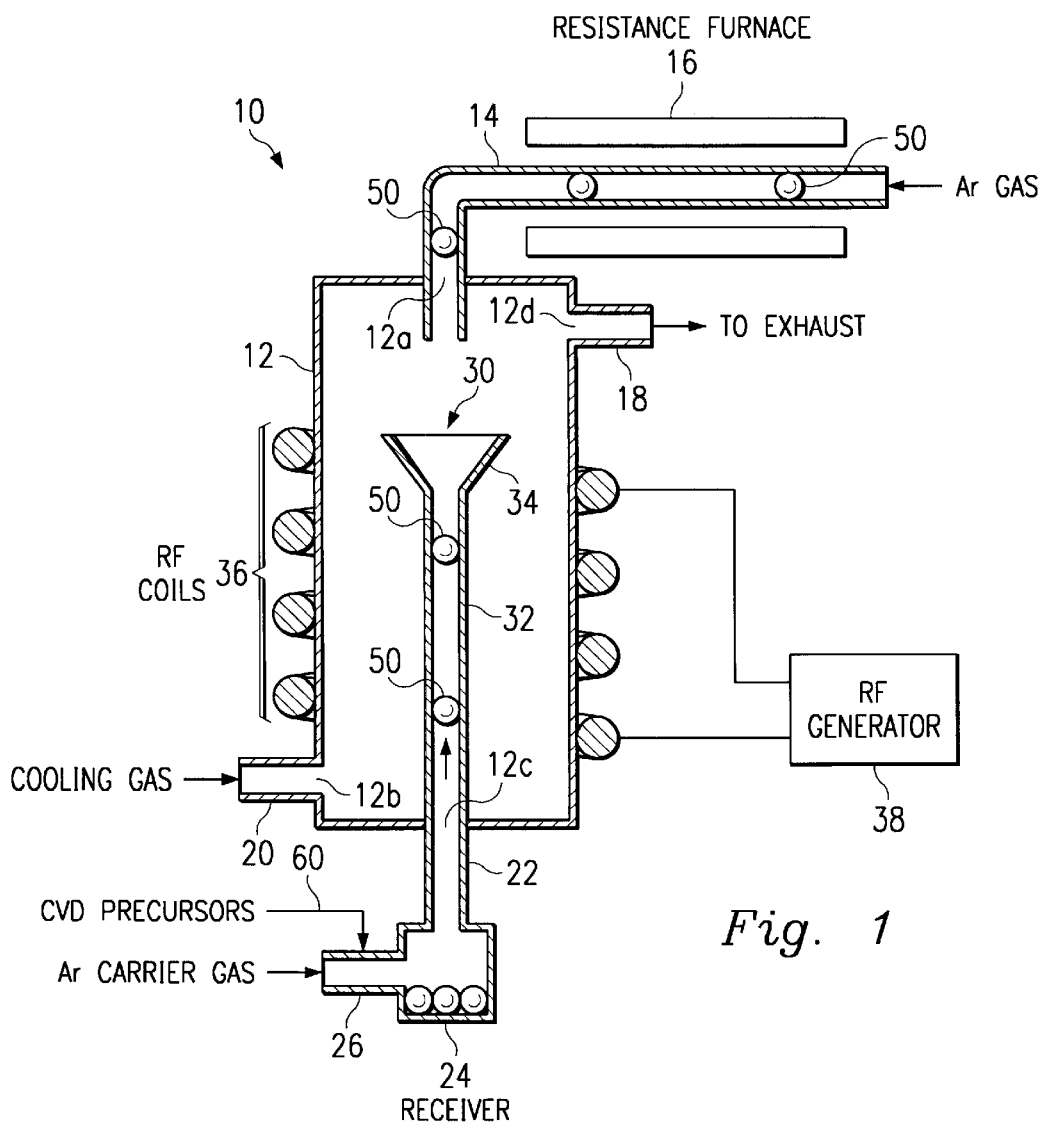
FIG. 1 illustrates a chemical vapor deposition processor according to one embodiment of the invention.

Referring to FIG. 1, the reference numeral 10 designates, in general, one embodiment of a processor for growing a film on a spherical shaped semiconductor device using chemical vapor deposition ("CVD"). Moreover, multiple processes, such as processing a consecutive sequence of devices, is possible by varying parameters described herein.

The processor 10 includes an enclosure 12 in the form of a hollow tube having two inlet openings 12a, 12b, one inlet/outlet opening 12c, and one outlet opening 12d. The outlet opening 12c is located diametrically opposite the inlet opening 12a and the outlet opening 12d is located diametrically opposite the inlet opening 12b.

One end of a vertically extending inlet conduit 14 registers with the inlet opening 12a to allow a supply of devices and carrier gas to be introduced into the enclosure 12. An electric furnace 16 surrounds an upstream portion of the conduit 14, the furnace 16 providing radiant heat inside the conduit. An exhaust conduit 18 registers with the opening 12d to allow exhaust fumes to be expelled from the enclosure 12. A cooling conduit 20 registers with the opening 12b and allows a cooling gas to be injected into the enclosure 12. One end of a discharge conduit 22 registers with the opening 12c and allows any devices received through the opening 12a to exit the enclosure 12. The opposite end of the discharge conduit 22 registers with a receiver section 24, which is further connected with a gas and materials conduit 26 for providing gases and/or other process constituents to the enclosure 12.

Imposed within the enclosure 12 is a processing chamber 30 having a tube portion 32 and a funnel portion 34. The tube portion 32 registers with and interconnects the funnel portion 34 and the discharge conduit 22. The chamber 30 is coaxial with a coiled electrical conductor 36 that surrounds the outer surface of the enclosure 12. The coil 36 is connected to a radio frequency ("RF") generator 38 for creating an RF current and producing RF heating energy inside the chamber 30.

In operation, a plurality of spherical devices 50, each of a semiconductor material, are introduced into the conduit 14. The spherical devices 50 are preferably of a generally spherical shape and could be of the same type formed according to the technique disclosed in the above-identified and presently incorporated patent application Ser. No. 08/858,004. Included with the spherical devices 50 is a process gas, such as an argon (Ar) carrier gas with CVD constituents. The process gases serve to float the spherical devices throughout the conduit 12 as well as to provide deposition chemicals. As the spherical devices 50 pass through the conduit 14, they are preheated to 600–800° C. by the resistance-type furnace 16. This preheating serves to make the surface of the spherical devices 50 more conductive, and thereby more susceptible to receiving RF energy, which enables film growth to take place on the surface of the spherical devices 50 but not on the walls of the enclosure 12.

The spherical devices 50 exit the conduit 14 at the opening 12a and descend down (as shown in the figure) towards the chamber 30. Once the spherical devices 50 enter the funnel portion 34, they are directed towards the tube portion 32. Normally, the spherical devices 50 will be spinning due to rotating momentum. After traversing the interior of the chamber 30, the spherical devices 50 pass through the outlet opening 12c, through the discharge conduit 22, and into the receiver 24. The introduction and discharge of the spherical devices 50 in this manner is controlled to prevent the accumulation of a relatively large number of spherical devices in the chamber 30 at the same time.

During this flow of the spherical devices 50 through the chamber 30, one or more gases, including chemical vapor deposition constituents (collectively CVD precursors 60), are introduced from the gas and materials conduit 26, through the discharge conduit 22, and into the chamber 30. In addition, another process gas, such as Ar or N2, is introduced into the discharge conduit 26 and the chamber 30. The Ar or N2 gas introduced through the discharge conduit 26 mainly serves to float the spherical devices 50 towards the receiver 24, thereby controlling the rate of descent of the spherical devices through the chamber 30.

During the passage of the Ar gas and CVD precursors 60 through the tube portion 32 of the chamber 30, the coil 36 is activated by the RF generator 38. The coil 36 thereby applies the RF energy to the spherical devices 50. The RF energy is concentrated in the center of the enclosure 12 and hence the center of the coaxial tube portion 32. As a result, the enclosure 12 is not heated to a great extent and, is further cooled by cooling gas flowing from the cooling conduit 20 through the opening 12b. The RF generator 38 produces the RF energy at a frequency of more than 10 kHz, which produces a relatively high temperature of about 600–1200° C. It is understood that this frequency and temperature does not generate inductively coupled plasma.

The chamber 30 now includes the CVD precursors 60, the high amount of RF energy, and the plurality of spherical devices 50 moving therethrough. The CVD precursors 60, in combination with the RF energy from the coil 36, grow a thin film on the outer surface of the spherical devices 50. The preheating of the spherical devices 50 makes their outer surface more conductive, which facilitates the deposition. The deposition rate can be controlled by the RF energy from the coil 36 and the descent rate of the spherical devices 50.

Figure 2:
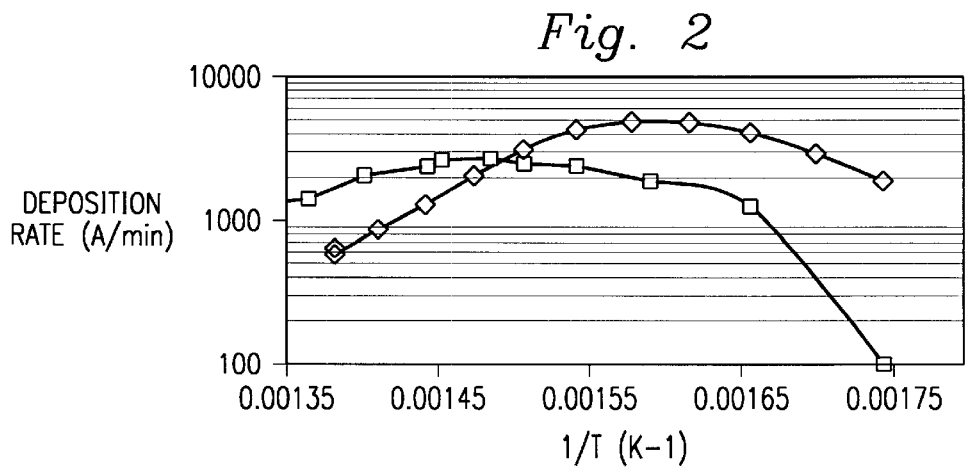
FIG. 2 is a graph illustrating the relationship of the deposition rate of TEOS according to the inverse temperature.

A preferred embodiment for an efficient method for depositing $SiO_2$ films on the surface of spherical shaped devices at a much faster speed will now be described. An inert gas, such as Ar or $N_2$, flows through a liquid Tretra-ethaloxisilane (TEOS) bubbler, which is within the discharge conduit 26, and delivers TEOS vapor into CVD chamber 30. Ozone, a CVD precursor 60, is generated in an ozone generator and is also sent to the CVD chamber 30 via the discharge conduit 26 to catalyze a CVD reaction. The gas stream of TEOS vapor, ozone and carrier gas flows upward and provides suspension to the spherical device. $SiO_2$ films are formed on the device surface by the chemical reaction of TEOS at a temperature of about 360° C. As shown in FIG. 2, the film growth rate increases as the deposition temperature goes up from 300° C. to 360° C., reaches its highest level at 360° C. and then decreases as the deposition temperature goes up from 360° C. to 400° C.

Figure 3:
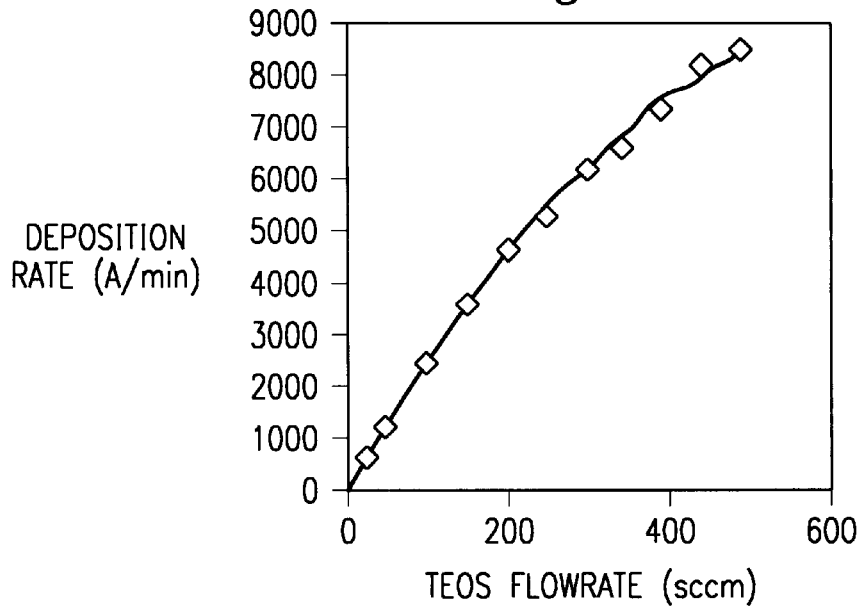
FIG. 3 is a graph illustrating the relationship of the deposition rate of TEOS according to the flowrate of TEOS.

The TEOS delivery rate also has a direct influence on the film growth rate, as shown in FIG. 3. As seen in the figure, the $SiO_2$ growth rate improves almost linearly with the TEOS delivery rate. At optimized conditions, the TEOS deposition rate is about one magnitude higher than the conventional semiconductor process.

Figure 4:
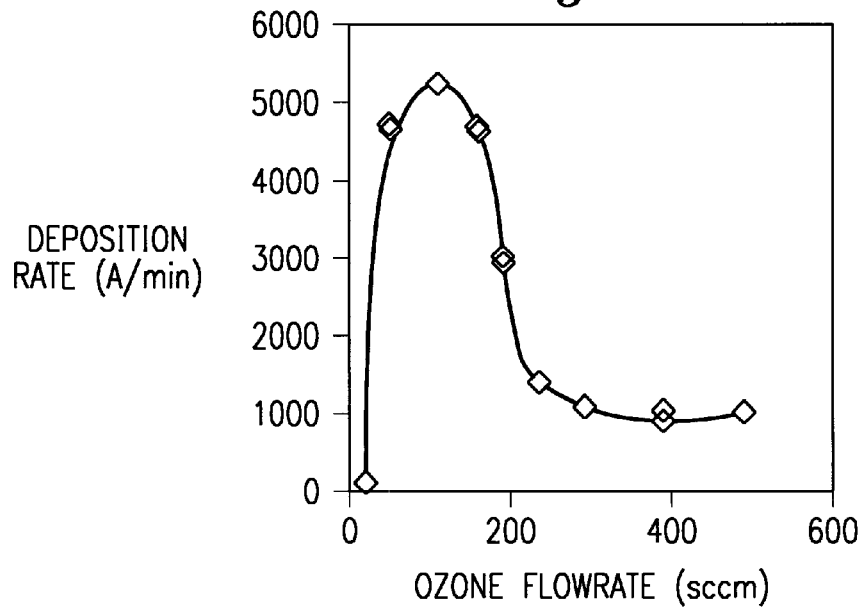
FIG. 4 is a graph illustrating the relationship of the deposition rate of TEOS according to the flowrate of ozone.

FIG. 4 shows the effect of the ozone flow rate on the film growth rate. The film growth rate increases very quickly as the Ozone flow rate is raised from 2 standard cubic centimeters per minute (sccm) to 100 sccm. As more Ozone is delivered to the system, the film growth rate decreases from 5000 Å/min to 1000 Å/min.

A preferred embodiment for efficiently depositing $Si_3N_4$ films on the surface of a spherical shaped device at a much faster speed will now be described. A gas stream of inert gas (i.e. $N_2$ or Ar), $SiH_4$ and $NH_3$ flows through the discharge conduit 26 and provides the spherical device with suspension and rotation. Uniform $Si_3N_4$ film can be deposited on the device surface at high speed by chemical reaction of $SiH_4$ with $NH_3$ at a temperature of about 750° C.

Figure 5:
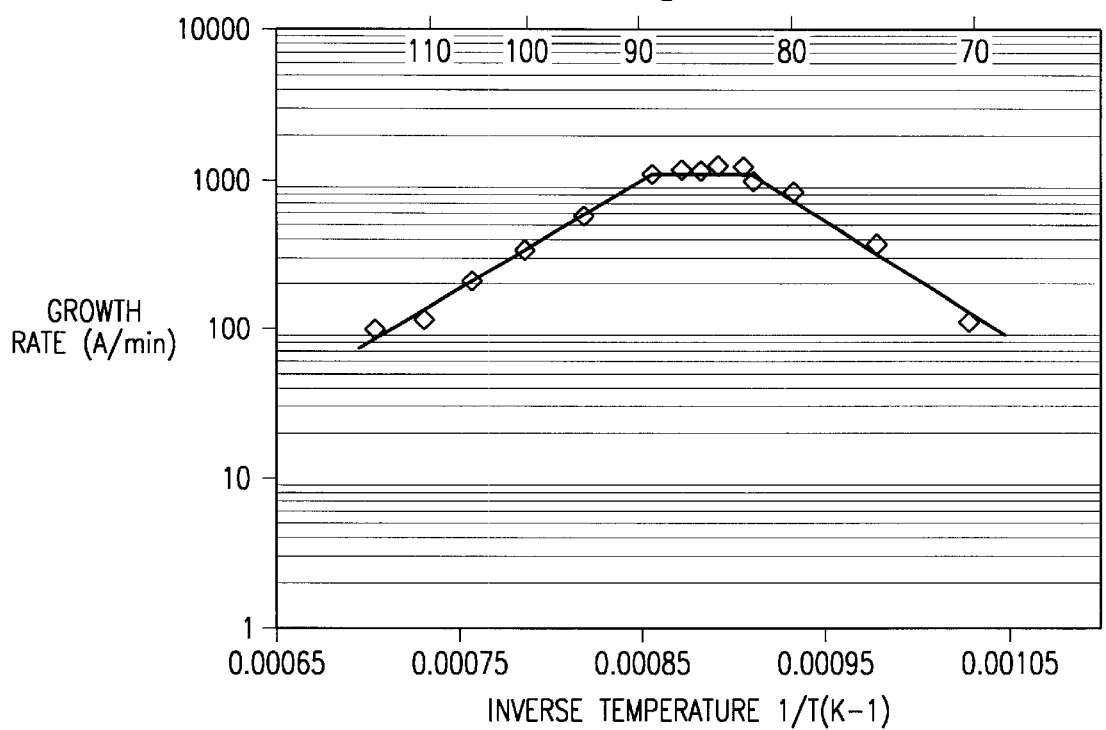
FIG. 5 is a graph illustrating the relationship of the growth rate of $Si_3N_4$ according to the inverse temperature.

Now referring to FIG. 5, at the deposition temperature of about 675° C. to 815° C., the film growth rate shows an exponential increase with the temperature, which may indicate that the overall film growth rate is controlled by the surface reaction. As the deposition temperature enhances, the film deposition rate shows almost no dependence with the temperature in the range of 815° C. to 900° C. However, the $Si_3N_4$ growth rate then decreases when the deposition temperature exceeds 900° C.

Figure 6:
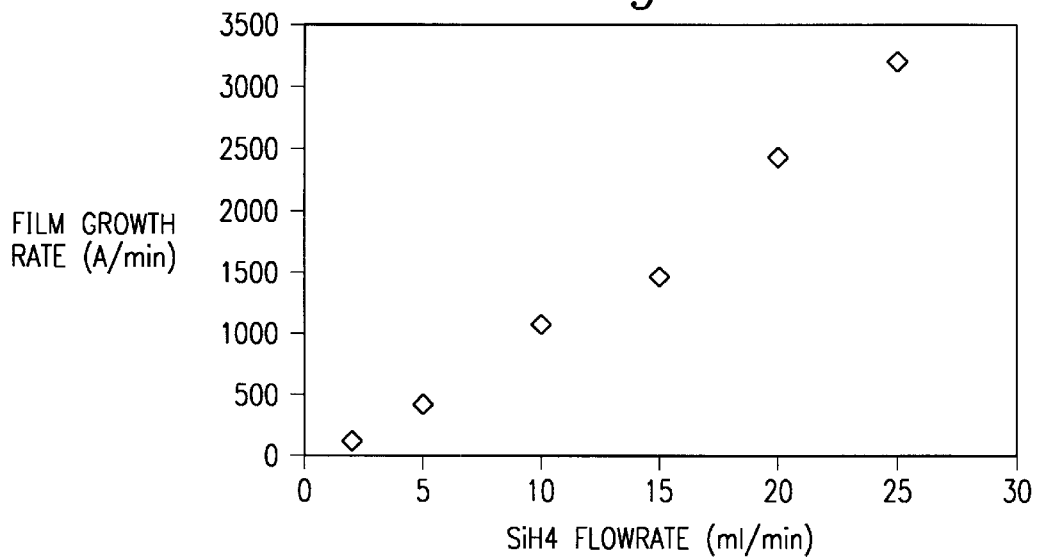
FIG. 6 is a graph illustrating the relationship of the growth rate of $Si_3N_4$ according to the flowrate of $SiH_4$.

In addition, as shown in FIG. 6, the film growth rate shows a linear increase with the $SiH_4$ delivery rate.

It is understood that several variations may be made in the foregoing. For example, the invention is not limited to the specific orientation of the various inlet and outlet conduits relative to the processor 10 described above. Thus the spherical devices 50 and the gases can travel in a direction through the chamber 30 other than a vertical and horizontal direction, respectively, as described above. Also the shape of the chamber 30 can be changed to facilitate different requirements. Other modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. An apparatus for Chemical Vapor Deposition ("CVD") processing for a semiconductor device, the apparatus comprising:
    a first enclosure containing a plurality of apertures and a conductor coil;
    a second enclosure coaxial with the conductor coil for defining a chamber;
    a voltage generator electrically connected to the conductor coil;
    a first conduit registering with an aperture of the first enclosure for supplying the semiconductor device;
    a first inlet registering with the chamber for receiving the semiconductor device from the first conduit;
    a preheater furnace proximate to the first enclosure for preheating the semiconductor device to a first temperature before the semiconductor device is received by the first inlet; and
    a second inlet registering with the chamber for receiving a plurality of chemical precursors at a predefined controlled flowrate for CVD processing of the semiconductor device, wherein the voltage generator supplies a voltage differential to the conductor coil, thereby heating the device to a predefined second temperature associated with the chemical precursors as it moves past the first inlet and wherein the chemical precursors include TEOS and ozone and the predefined temperature is between 320° C. and 380° C.

2. The apparatus of claim 1 further comprising a first outlet registering with the chamber for receiving and discharging the semiconductor device from the chamber.

3. The apparatus of claim 1 further comprising a first outlet registering with an aperture of the first enclosure for receiving and discharging exhaust fumes.

4. The apparatus of claim 1 wherein the preheater furnace is a resistance-type furnace.

5. The apparatus of claim 4 wherein the preheater furnace surrounds the first conduit.

6. The apparatus of claim 1 wherein the second enclosure includes a funnel-shaped portion.

7. The apparatus of claim 1 wherein the semiconductor device moves through the chamber at a controlled rate.

8. The apparatus of claim 7 wherein the rate at which the semiconductor device moves through the chamber is controlled by gravity and by a process gas injected into the chamber through the second inlet.

9. The apparatus of claim 1 wherein the semiconductor device is substantially spherical in shape, and the CVD process grows a thin film on the outer surface of the device.

10. A process tube for performing chemical vapor deposition on a sequence of spherical shaped semiconductor devices, the tube comprising:
    a conductor coil electrically connected to a radio frequency (RF) energy generator;
    a chamber coaxial with the conductor coil and inside the process tube;
    a first conduit registering with a first opening in the process tube for inputting the semiconductor devices into the process tube;
    a second conduit registering with a second opening in the process tube for outputting the semiconductor devices from the process tube;
    a preheater furnace proximate to the first conduit for preheating the semiconductor devices; and
    means for inserting a plurality of chemical precursors at a predefined flowrate into the chamber;
    such that, when the preheated semiconductor devices enter the chamber, the devices are further heated to a predefined temperature associated with the chemical precursors, by RF energy from the conductor coil and react with the inserted chemical precursors and wherein the chemical precursors include TEOS and ozone and the predefined temperature is between 320° C. and 380° C.

11. The process tube of claim 10 wherein the second conduit inserts a process gas into the chamber to affect the movement of the semiconductor devices through the chamber.

12. The process tube of claim 10 wherein the preheater furnace surrounds the first conduit.

13. The process tube of claim 10 wherein the semiconductor devices move through the chamber at a controlled rate.

14. The process tube of claim 10 wherein the means for inserting at least one chemical precursor uses the second conduit.

15. The process tube of claim 10 wherein the conductor coil is positioned outside of the process tube.

16. A method for performing chemical vapor deposition on a sequence of spherical shaped semiconductor devices, the method comprising:
    sequentially preheating the semiconductor devices;
    sequentially providing the preheated semiconductor devices through a first opening in a process tube;
    directing each of the semiconductor devices in the process tube to a chamber coaxial with a conductor coil electrically connected to a radio frequency (RF) energy generator;
    providing at least one chemical precursor into the chamber for deposition on the surface of each of the semiconductor devices wherein the at least one chemical precursor includes TEOS and ozone;

heating each of the semiconductor devices with RF energy from the conductor coil to a predefined temperature associated with the at least one chemical precursors; and sequentially outputting the semiconductor devices from the chamber and from the process tube.

17. The method of claim 16 further comprising:

controlling the movement of the semiconductor devices through the chamber.

18. An apparatus for Chemical Vapor Deposition ("CVD") processing for a semiconductor device, the apparatus comprising:

a first enclosure containing a plurality of apertures and a conductor coil;

a second enclosure coaxial with the conductor coil for defining a chamber;

a voltage generator electrically connected to the conductor coil;

a first conduit registering with an aperture of the first enclosure for supplying the semiconductor device;

a first inlet registering with the chamber for receiving the semiconductor device from the first conduit;

a preheater furnace proximate to the first enclosure for preheating the semiconductor device to a first temperature before the semiconductor device is received by the first inlet; and a second inlet registering with the chamber for receiving a plurality of chemical precursors at a predefined controlled flowrate for CVD processing of the semiconductor device, wherein the voltage generator supplies a voltage differential to the conductor coil, thereby heating the device to a predefined second temperature associated with the chemical precursors as it moves past the first inlet and wherein the chemical precursors include $SiH_4$ and $NH_3$ and the predefined temperature is between 675° C. and 915° C.

19. The apparatus of claim 18 further comprising a first outlet registering with the chamber for receiving and discharging the semiconductor device from the chamber.

20. The apparatus of claim 18 further comprising a first outlet registering with an aperture of the first enclosure for receiving and discharging exhaust fumes.

21. The apparatus of claim 18 wherein the preheater furnace is a resistance-type furnace.

22. The apparatus of claim 21 wherein the preheater furnace surrounds the first conduit.

23. The apparatus of claim 18 wherein the second enclosure includes a funnel-shaped portion.

24. The apparatus of claim 18 wherein the semiconductor device moves through the chamber at a controlled rate.

25. The apparatus of claim 24 wherein the rate at which the semiconductor device moves through the chamber is controlled by gravity and by a process gas injected into the chamber through the second inlet.

26. The apparatus of claim 18 wherein the semiconductor device is substantially spherical in shape, and the CVD process grows a thin film on the outer surface of the device.

27. A process tube for performing chemical vapor deposition on a sequence of spherical shaped semiconductor devices, the tube comprising:

a conductor coil electrically connected to a radio frequency (RF) energy generator;

a chamber coaxial with the conductor coil and inside the process tube;

a first conduit registering with a first opening in the process tube for inputting the semiconductor devices into the process tube;

a second conduit registering with a second opening in the process tube for outputting the semiconductor devices from the process tube;

a preheater furnace proximate to the first conduit for preheating the semiconductor devices; and means for inserting a plurality of chemical precursors at a predefined flowrate into the chamber;

such that, when the preheated semiconductor devices enter the chamber, the devices are further heated to a predefined temperature associated with the chemical precursors, by RF energy from the conductor coil and react with the inserted chemical precursors and wherein the chemical precursors include $SiH_4$ and $NH_3$ and the predefined temperature is between 675° C. and 915° C.

28. The process tube of claim 27 wherein the second conduit inserts a process gas into the chamber to affect the movement of the semiconductor devices through the chamber.

29. The process tube of claim 27 wherein the preheater furnace surrounds the first conduit.

30. The process tube of claim 27 wherein the semiconductor devices move through the chamber at a controlled rate.

31. The process tube of claim 27 wherein the means for inserting at least one chemical precursor uses the second conduit.

32. The process tube of claim 31 wherein the conductor coil is positioned outside of the process tube.

33. A method for performing chemical vapor deposition on a sequence of spherical shaped semiconductor devices, the method comprising:

sequentially preheating the semiconductor devices;

sequentially providing the preheated semiconductor devices through a first opening in a process tube;

directing each of the semiconductor devices in the process tube to a chamber coaxial with a conductor coil electrically connected to a radio frequency (RF) energy generator;

providing at least one chemical precursor into the chamber for deposition on the surface of each of the semiconductor devices;

heating each of the semiconductor devices with RF energy from the conductor coil to a predefined temperature associated with the at least one chemical precursors; and sequentially outputting the semiconductor devices from the chamber and from the process tube.

34. The method of claim 33 further comprising:

controlling the movement of the semiconductor devices through the chamber.

* * * * *